United States Patent [19]

Williams

[11] 4,205,267
[45] May 27, 1980

[54] HIGH SPEED ELECTROSTATIC VOLTMETER

[76] Inventor: Bruce T. Williams, 86 Park Lane Cir., Lockport, N.Y. 14094

[21] Appl. No.: 848,345

[22] Filed: Nov. 3, 1977

[51] Int. Cl.² .................. G01R 5/28; G01R 29/12
[52] U.S. Cl. .................................. 324/458; 324/72
[58] Field of Search ............ 324/32, 72, 109, 123 R, 324/149, 458

[56] References Cited

U.S. PATENT DOCUMENTS

| | | | |
|---|---|---|---|
| 2,721,908 | 10/1955 | Moe | 324/123 R |
| 4,054,835 | 10/1977 | Los et al. | 324/72 |

Primary Examiner—Rudolph V. Rolinec
Assistant Examiner—Ernest F. Karlsen
Attorney, Agent, or Firm—Christel, Bean & Linihan

[57] ABSTRACT

A large bandwidth non-contacting voltage follower for detecting and following both static or d.c. and dynamic or a.c. data of an electrical field or potential being measured. A probe or sensor includes a pair of voltage sensitive electrodes which are vibrated or oscillated within a housing to vary the capacitive coupling between the electrodes and external field or potential in an inverse manner to induce signals on the electrodes having static and dynamic data from the field or potential. The signals are processed and applied to the input of a voltage follower amplifier, the output of which is coupled to the probe housing as a reference, so that the follower output follows the static and dynamic characteristics of the external field or potential.

23 Claims, 14 Drawing Figures

HIGH SPEED ELECTROSTATIC VOLTMETER

BACKGROUND OF THE INVENTION

This invention relates to the electrical measurement art, and more particularly to a new and improved non-contacting voltage follower.

Electrostatic voltmeters measure electrostatic fields and potentials of surfaces without current flow and in a non-contacting manner. A probe or sensor converts an electrostatic field or surface potential to an a.c. voltage, the magnitude of which is proportional to the field or potential being measured. This conversion is accomplished by a capacitive modulation process wherein the capacitive coupling between a detector or electrode associated with the probe and a surface associated with the field or potential to be measured is modulated or varied at a fixed periodic rate, usually by mechanically vibrating the detector at such rate. A voltage difference existing between the surface and electrode will induce an a.c. voltage on the probe electrode which is processed by circuitry to give a measurement.

Heretofore, the bandwidth of electrostatic voltage followers has been limited to a function of the electrostatic detector operating or vibrating frequency. The detector usually is mechanically vibrated either in a plane parallel to the test surface to alternately expose and shield the detector relative to the surface in conjunction with an aperture in an interposed wall or it is vibrated in a plane perpendicular to the test surface. The bandwidth limitation is imposed because of the fact that the feedback which is employed in voltage followers of this type to drive the average detector voltage level back to the unknown potential being measured must assume a level which looks average or at least steady for several cycles of the detector modulating signal. According to the Nyquist Sampling Theorem, the bandwidth of a sampling system cannot exceed one-half the sampling rate. In present electrostatic voltage followers of the modulated detector type, the mechanical rate of modulation does not exceed 1-2 kilohertz which establishes the theoretical maximum bandwidth at 500 hertz to 1000 hertz.

SUMMARY OF THE INVENTION

It is, therefore, an object of this invention to provide a new and improved non-contacting voltmeter of the voltage follower type.

It is a further object of this invention to provide such a voltage follower of increased bandwidth.

It is a further object of this invention to provide such a voltage follower capable of following both the static and dynamic characteristics of an external field or potential being measured.

It is a further object of this invention to provide such a voltage follower which is efficient and effective in operation and relatively simple in construction.

The present invention provides a non-contacting voltage follower comprising a pair of voltage sensitive electrodes, an electrical reference operatively connected to the electrodes, and means for varying the capacitive coupling between the electrodes and an electrical field or potential to which the electrodes are exposed and in an inverse manner to induce signals on the electrodes. The foregoing can comprise a probe including a housing containing the electrodes and having an operative surface provided with an opening therein through which the electrodes are exposed to the field or potential and means for vibrating the electrodes relative to the opening to vary the capacitive coupling as a function of the rate of vibration; the housing operative surface being conductive and serving as the reference. The voltage follower further comprises an amplifier connected as a voltage follower, signal processing means operatively connected to the electrodes and to the follower input for applying to the follower signals containing both static and dynamic data of the field or potential derived from the signals induced on the electrodes. The output of the follower is coupled to the electrical reference of the electrodes, and the follower output follows the static and dynamic characteristics of the electrical field or potential. The signal processing means can comprise a first channel wherein the sum of the signals induced on the electrodes is coupled to the follower input and a second channel wherein the difference of the signals induced on the electrodes is demodulated, integrated and then applied to the follower input. Alternatively, the signal processing means can process the sum and difference signals simultaneously and apply the sum and demodulated difference signals to the follower input along a single path or channel.

The foregoing and additional advantages and characterizing features of the present invention will become clearly apparent upon a reading of the ensuing detailed description wherein:

DETAILED DESCRIPTION OF THE ILLUSTRATED EMBODIMENTS

Figure 1:
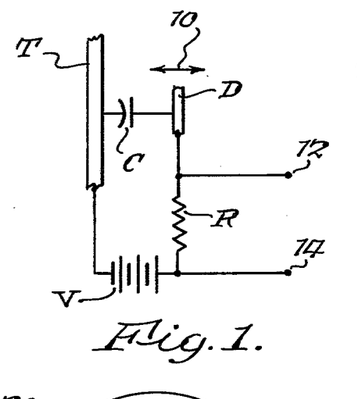
FIG. 1 is a schematic circuit diagram of a basic electrostatic voltage sensor.

Referring now to FIG. 1, there is illustrated a basic electrostatic voltage sensor wherein a detector surface D is vibrated in the direction of the arrow 10 relative to a test surface T. The capacitance between the detector surface and test surface is designated C, and the voltage between the two surfaces is designated V. Detector modulation is accomplished by vibrating the detector surface D in the direction indicated by arrow 10, and the voltage across resistance R on the terminals 12, 14 is proportional to the voltage V and the modulation of the capacitance C due to the motion of surface D. If the voltage V were replaced with a sinusoidal source having a frequency equal to the frequency of oscillation of detector surface D, the same voltage would be produced across resistor R. In other words, the detector system shown in FIG. 1 could not determine the difference between these two different voltage sources. The detector cannot determine whether signals induced on it are generated because of vibration of the detector relative to a fixed voltage difference between the detector and test surface, or a.c. signals of the same frequency which are generated by the test surface.

The charge between detector surface D and test surface T is obtained from the well-known relation:

$$Q = CV$$

where C and V are the quantities as defined above. The total current flowing through resistor R which produces the output voltage is obtained from the total differental of the foregoing system equation:

$$i = (dQ/dt) = V(dC/dt) + C(dV/dt)$$

In accordance with the present invention there is provided a system having a detector which distinguishes between the two terms on the right hand side of the system equation. The system of the present invention serves to establish in a feedback system an output which when fed back to a detector reference surface represents or follows the two separate components which are the average or d.c. value V(dc/dt), where V is the average value, and the a.c. or dynamic value C(dV/dt) where (dV/dt) is the a.c. or dynamic value.

Figure 2:
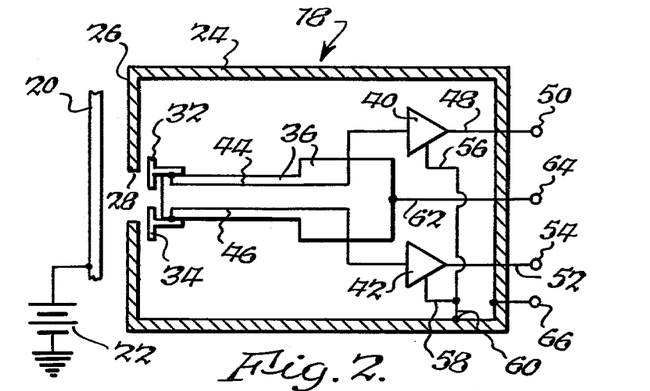
FIG. 2 is a diagrammatic view of a sensor according to the present invention.

A probe or sensor 18 according to the present invention is illustrated diagrammatically in FIG. 2 adjacent a test surface 20 which in the system shown is a charged surface of constant voltage 22 relative to the surface of probe 18. Probe 18 comprises a housing 24 which in the device shown is hollow cylindrical in shape having an operative end surface 26 provided with an opening or aperture 28 therethrough. The operative surface 26 is of a material capable of holding or retaining an electrical potential applied thereto, preferably of electrically conducting material such as metal, and in the device shown the entire housing 24 is of such material. In addition, the operative surface 26 is one end or surface of the cylindrical housing 24 but it can be located elsewhere on the housing as will be explained hereafter. Aperture 28 is of circular shape in the device shown but can have other shapes as well. The opposite end surface of housing 24 is closed and provided with an opening or openings for passage therethrough of electrical leads which will be described in detail presently.

The probe 18 further comprises first and second voltage sensitive electrodes 32 and 34, respectively, each having an operative surface disposed toward the probe operative surface 26 and the opening 28 therein. The electrodes 32, 34 are fixed to a vibrator means 36 in the form of an electromechanical transducer which, in turn, is secured within the housing 24. When a driving signal is applied to the transducer 36 it operates to vibrate the electrodes 32, 34 at a vibratory frequency and amplitude determined by the frequency and amplitude of the driving signal and by the mechanical characteristics of the transducer 36. For example, transducer 36 can comprise a tuning fork with the electrodes 32, 34 attached to the end of a tine and with piezoelectric crystal drivers attached to the opposite ends of the tines. A more detailed description of tuning fork vibrators for devices of this general type is found in U.S. Pat. No. 3,852,667 issued Dec. 3, 1974, the disclosure of which is hereby incorporated by reference. In response to operation of transducer 36, each electrode 32, 34 is vibrated or moved alternately in a direction to vary the amount of the electrode operative surface which is exposed through the opening 28 to the surface 20 bearing the field potential being measured. In particular, the operative surface of each electrode 32, 34 is disposed in a plane generally parallel to the plane of opening 28 in probe operative surface 26 and is vibrated in that plane. The operative surface of each electrode 32, 34 is moved into and out of registry with at least a portion of the opening 28, and each electrode is moved between a position where a maximum portion of the operative surface is exposed to a position where a minimum, preferably none, of the operative surface of each electrode is exposed during each vibratory cycle thereof as will be explained in detail presently.

Probe 18 further comprises first and second follower type amplifiers 40 and 42, respectively. Line 44 connects detector 32 to the input of amplifier 40, and line 46 connects detector 34 to the input of follower 42. The followers 40 and 42 provide very high impedance loads for detectors 32 and 34, respectively. The output of follower 40 is connected by a line 48 extending through housing 24 to a probe terminal 50 for connection to external circuitry. Similarly, the output of follower amplifier 42 is connected by a line 52 extending through probe housing 24 to a probe terminal 54 for connection to external circuitry. Lines 56 and 58 connect reference terminals of amplifiers 40 and 42, respectively, to a point 60 on the probe housing 24 which serves as an electrical reference. In the system shown, the entire housing including surface 26 is of electrically conducting material. Alternatively, only surface 26 might be of electrically conducting material in which case point 60 and the connections thereto would be on surface 26. Transducer 36 is connected by a line 62 extending through housing 24 to a probe terminal 64 for connection to a source providing an electrical driving signal for the transducer in a manner which will be described. Another probe terminal 66 is connected to the conductive housing so as to be connected electrically to the reference point 60.

Figure 3A:
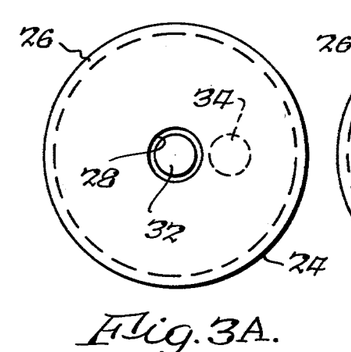
FIGS. 3A, 3B and 3C are diagrammatic views illustrating operation of the sensor of FIG. 2.
Figures 3B, 3C:
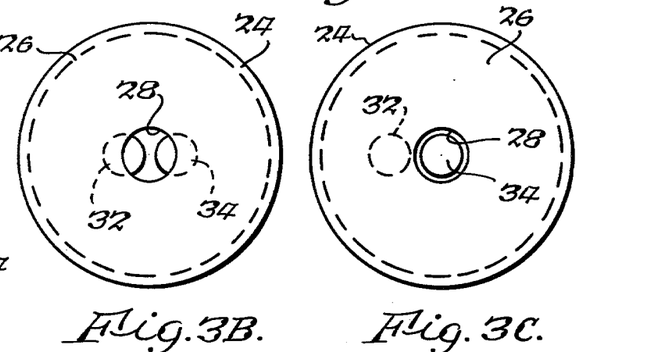

FIG. 3 illustrates the manner in which the vibrator means 36 moves the electrodes 32 and 34 to alternately expose and shield the detector surfaces thereof through the aperture 28. In particular, FIG. 3A illustrates the relative position of the electrodes 32, 34 at one extreme point in the mechanical oscillatory cycle of the transducer 36. In the position shown, electrode 32 is completely exposed through aperture 28 to the test surface 20 and electrode 34 is completely shielded from the test surface 20. Thus the capacitive coupling to electrode 32 is a maximum while the coupling to electrode 34 is a minimum or zero. FIG. 3B shows the relative positions of the electrodes 32, 34 relative to aperture 28 at the rest position of the vibrator 36 as illustrated in FIG. 2 which also is the intermediate point of a mechanical oscillatory cycle. In this position, equal portions of each of the electrode surfaces 32, 34 are exposed through aperture 28 to the test surface 20. As the electrodes are moved from the position of FIG. 3A to the position of FIG. 3B, the capacitive coupling between electrode 32 and the test surface decreases while the capacitive coupling between the test surface and electrode 34 is increasing. FIG. 3C shows the positions of electrodes 32, 34 relative to aperture 28 at the other extreme point in the mechanical oscillatory cycle opposite the position of 3A. In this position, all of the surface of electrode 34 is exposed through aperture 28 to the test surface 20, and the entire surface of electrode 32 is shielded from the test surface. As the electrodes are moved from the position of FIG. 3B to the position of FIG. 3C, the capacitive coupling between electrode 32 and the test surface decreases further to a minimum or null while the capacitive coupling of electrode 34 to the test surface increases further to a maximum. Throughout the entire mechanical vibratory cycle the sum of the areas of electrodes 32, 34 exposed through aperture 28 to test surface 20 is approximately the same. In other words, the total area of the electrodes 32, 34 which is exposed through aperture 28 over the vibratory cycle remains substantially constant. The operative surfaces of electrodes 32, 34 are generally circular in the device shown but can have other shapes as well.

Figure 4:
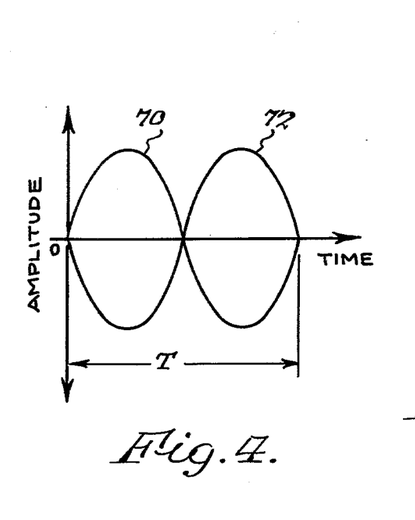
FIG. 4 is a graphic view of waveforms generated by operation of the sensor of FIG. 2.

The waveforms of FIG. 4 illustrate signals derived from the outputs of the follower amplifiers 40, 42 when probe 18 is positioned close to a test surface 20 of constant voltage relative to the probe surface and relative to the common or reference circuit of the follower amplifiers, and when the transducer 36 driven by a sinusoidal signal. In particular, waveform 70 is the signal appearing across terminals 50, 66 and waveform 72 is the signal appearing across terminals 54, 66. One complete cycle of the vibrator 36 is designated T in FIG. 4. This would be, for example, from the position of FIG. 3B to that of FIG. 3A, from that of FIG. 3A through that of FIG. 3B to that of FIG. 3C, and then back to that of FIG. 3B. The signals on the electrodes 32, 34 which give rise to the waveforms are rate induced signals which are a maximum when dC/dt is a maximum. This occurs at the point of maximum velocity of the electrode which, in turn, occurs where the electrode is moving through the intermediate position of FIG. 3B. The change in sign of the waveform occurs at the points shown in FIGS. 3A and 3C where the electrode movement changes from decreasing to increasing capacitive coupling.

Figure 5:
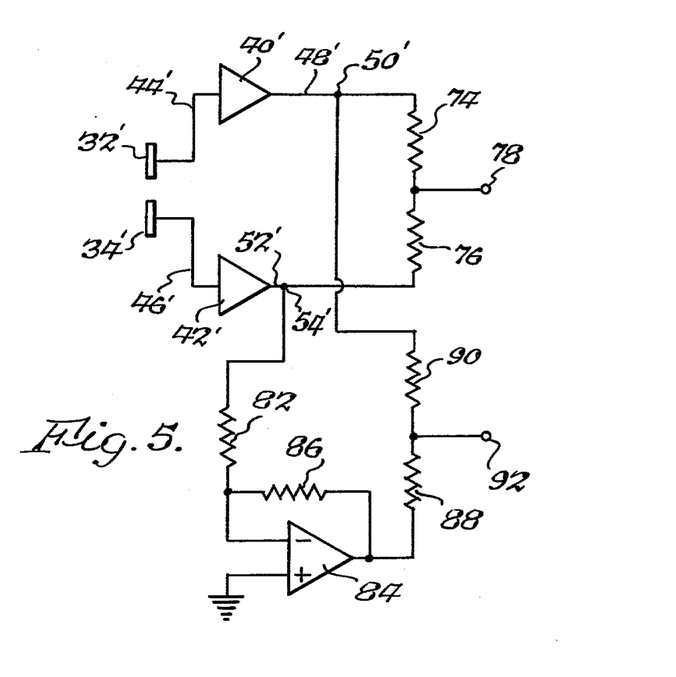
FIG. 5 is a schematic circuit diagram of the sensor of FIG. 2 and associated networks for deriving sum and difference signals.

In accordance with the present invention, if the two signals represented in FIG. 4 are summed in a voltage summing circuit, shown for example in FIG. 5, the two signals will cancel and produce no net signal for a constant voltage difference between the test surface 20 and the surfaces of electrodes 32, 34 which are coupled electrically to the common point of the follower amplifiers. The sum is derived by the series combination of resistors 74, 76 connected across terminals 50', 54' and is available on terminal 78. On the other hand, if at any time there appears on the test surface 20 dynamic data it will be coupled either to the detector 32 or the detector 34 or both of the detectors depending upon which detector is exposed through aperture 28. Because such dynamic data cannot be cancelled by summation at the output, and because the sum of the dynamic data on the detectors 32 and 34 is relatively constant, it will appear at the output of a summation circuit connected to the amplifiers 40, 42 without any attenuation due to the position of the vibrator 36. The dynamic data at the terminal 78 will be independent of position of the vibrating element 36. In accordance with the present invention, a signal in the form of the sum of the outputs of the follower amplifiers 40, 42 is coupled into the input of a voltage follower circuit having an output connected to the common or reference of the follower amplifiers 40, 42 and the probe 18 to provide a high fidelity follower which will follow the dynamic changes on the test surface in a manner which will be described in detail presently.

The outputs of the followers 40, 42 also are applied to a circuit which finds the difference between the two signals to develop a difference signal which is proportional to the magnitude of the constant voltage between the probe 18 and test surface 20. This difference signal also can contain dynamic data because dynamic data will only cancel if the position of the vibrating element 36 is in the rest position illustrated in FIGS. 2 and 3B. If the vibrating element is in any other position, the coupling between test surface 20 and the electrodes 32, 34 is unequal and this will produce a net difference signal. Such dynamic data can be removed as will be described presently. In the circuit of FIG. 5, the output terminal 54' of follower 42' is connected through a resistor 82 to the negative terminal of an operational amplifier 84, the positive terminal of which is connected to the circuit reference point. The output of amplifier 84 is connected back through a resistor 86 to the negative amplifier input terminal. The output of the amplifier also is connected through the series combination of resistors 88 and 90 to the output terminal 50' of the follower amplifier 40'. The difference signal is available on terminal 92 connected to the junction of resistors 88 and 90.

Figures 6, 7:
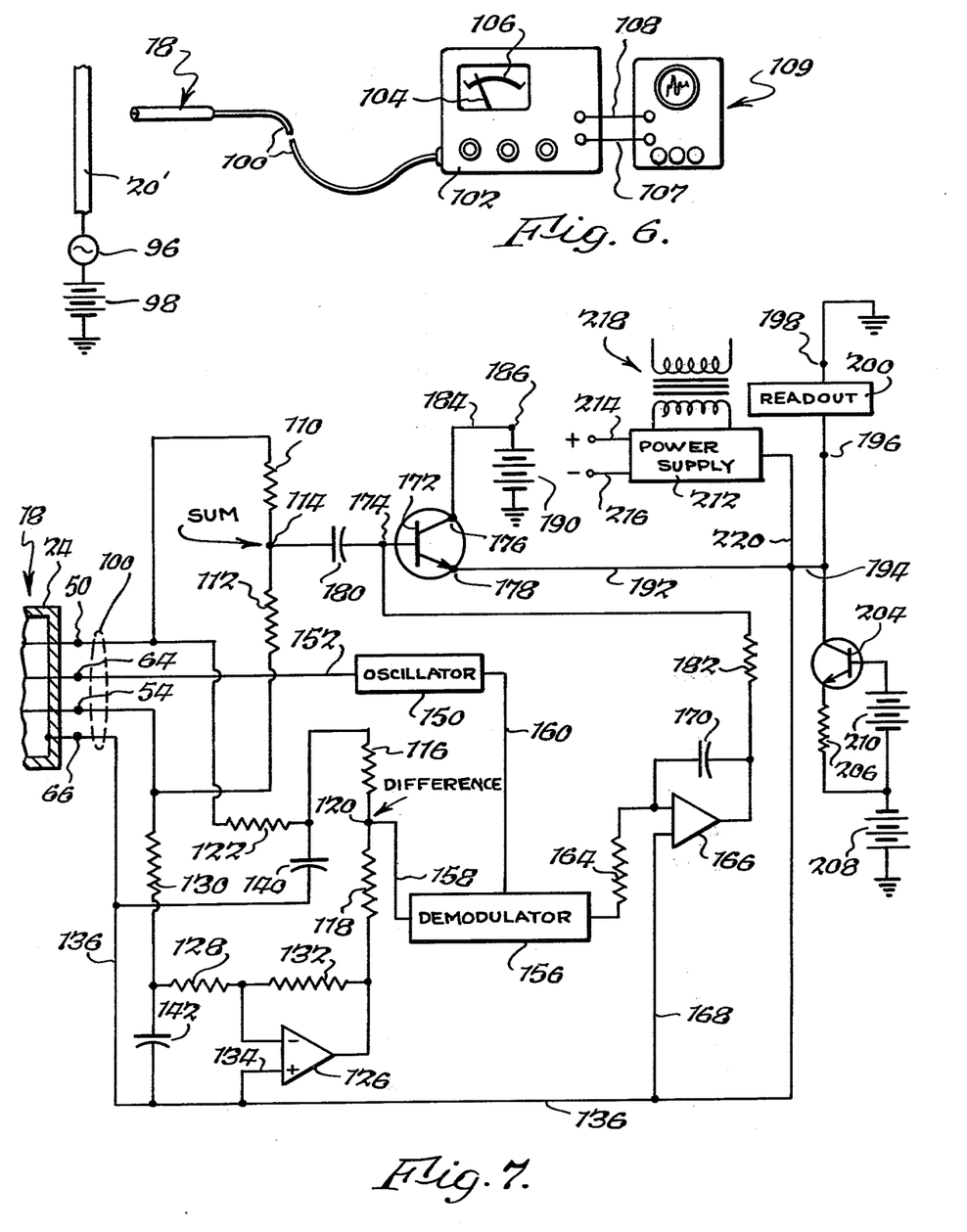
FIG. 6 is an elevational view, partly diagrammatic and with parts removed, of a non-contacting voltmeter according to the present invention.
FIG. 7 is a schematic circuit diagram with parts removed of the voltage follower according to the present invention.

FIGS. 6 and 7 illustrate a non-contacting voltmeter of the voltage followers type according to the present invention. FIG. 6 illustrates a non-contacting voltmeter including the high fidelity follower of the present invention for following both the static data and dynamic changes on a test surface designated 20' in FIG. 6. The dynamic data is represented by the a.c. source 96 and the static data by the d.c. source or battery 98. Probe 18 shown in FIG. 6 is similar to the probe illustrated in FIG. 2, and is connected by an electrical cable 100 to appropriate circuits within a meter assembly 102 including an indicator dial 104 and scale 106 from which the value of the measured static data is read. The meter assembly is connected by lines 107, 108 to an oscilloscope for reading the dynamic data. Alternatively, the static and dynamic data can be read by a single device.

FIG. 7 illustrates one form of circuit for processing the information derived from probe 18 in the system of FIG. 6. Probe 18 is shown fragmentarily in FIG. 7, it being understood that it is identical to probe 18 shown in FIG. 2. In this connection the probe terminals 50, 54, 64 and 66 are shown in FIG. 7 and lines connecting these terminals to the system circuit are included within the cable 100. A series combination of resistors 110, 112 is connected across the terminals 50 and 54, and the junction or terminal 114 between the resistors provides the signals representing the sum of the outputs of the follower amplifiers 40 and 42 in probe 18. The difference between these follower output signals is derived by a network including the series combination of resistors 116 and 118 having a junction or terminal 120 therebetween. Resistor 116 is connected through another resistor 122 to the probe terminal 50, and resistor 118 is connected to the output of an operational amplifier 126, the negative input terminal of which is connected through the combination of resistors 128 and 130 to the probe terminal 54. A feedback resistor 132 is connected between the negative input terminal and output terminal of amplifier 126. The positive input terminal of amplifier 126 is connected by a line 134 to a line 136 which is a circuit reference line connected to the terminal 66 which, in turn, is connected to the common of the probe housing and follower amplifiers 40, 42 therein. A capacitor 140 is connected from the junction of resistors 116, 122 to the reference line 136, and another capacitor 142 is connected from the junction of resistor 130 and resistor 128 to the reference line 136. The signal representing the difference between the outputs of follower amplifiers 40 and 42 is available on terminal 120.

The circuit of FIG. 7 also includes an oscillator 150 having an output which is connected by line 152 to the probe terminal 64. Oscillator 150 functions to provide a driving signal for operating the transducer 36 in probe 18. For example, oscillator 150 can provide an a.c. output signal which is applied to one piezoelectric element of transducer 36, and another piezoelectric element thereof provides a feedback signal to oscillator 150 whereby such feedback using the transducer as the resonant element causes oscillator 150 to operate at the mechanical resonance of the transducer element. The circuit of FIG. 7 further includes a demodulator 156, and circuit terminal 120 is connected by line 158 to the input of demodulator 156. As a result, the signal representing the difference between the outputs of the follower amplifiers 40 and 42 of probe 18 is applied to the input of demodulator 156. A line 160 connects demodulator 156 with oscillator 150 for synchronization. The output of demodulator 156 is connected through a resistor 164 to one input of an integrating amplifier 166, the other input of which is connected by line 168 to the circuit reference line 136. A feedback capacitor 170 is connected between the one input of amplifier 166 and the ouput.

The circuit of FIG. 7 further comprises an output follower amplifier in the form of transistor 172 which functions to sum the signals representative of the sum and difference of the signals of the probe follower amplifiers 40 and 42. In particular, transistor 172 has base, collector and emitter terminals 174, 176 and 178, respectively. The signal representing the sum of the probe follower amplifiers is on terminal 114 and is coupled through a capacitor 180 to base terminal 174. The output of integrating amplifier 166 is connected through a resistor 182 to the base terminal 174. The collector terminal 176 is connected by line 184 to a circuit terminal 186 which is connected to the positive side of a constant voltage source or battery 190, the negative terminal of which is connected to the circuit ground or reference point. Emitter terminal 178 is connected by a line 192 to the circuit reference line 136. The emitter terminal 178 also is connected by the combination of lines 192 and 194 in FIG. 7 to a pair of circuit output terminals 196, 198 across which a readout device 200 is connected. Readout device 200 can comprise, for example, the combination of meter 102 and scope 109 shown in FIG. 6 or alternatively a single device for reading both static and dynamic data. The other side of the device 200 is connected to circuit ground. The emitter terminal 178 also is connected by the combination of lines 192 and 194 to the collector terminal of a transistor 204, the emitter terminal which is connected through a resistor 206 to each negative terminal of a pair of constant voltage sources or batteries 208 and 210. The positive terminal of battery 208 is connected to ground, and the positive terminal of battery 208 is connected to the base of transistor 204. The circuit of FIG. 7 also includes a power supply designated 212 which provides positive and negative bias voltages for the circuit from terminals 214 and 216, respectively. The power supply 212 is connected through a transformer 218 to line a.c. voltage, and the power supply reference also is connected by a line 220 to the circuit reference line 136.

The system of FIG. 7 operates in the following manner. Probe 18 is positioned with operative surface 26 in the close but non-contacting relation to surface 20' having the field or potential to be measured. Electrodes 32, 34 are vibrated by operation of transducer 36 in the manner previously described, and oscillator 150 preferably provides a driving signal for transducer 36 at a frequency of about 500 hertz. As electrodes 32, 34 are vibrated, the capacitive coupling between the electrodes and surface 20' is varied in an inverse manner. In particular, as described in detail in connection with FIGS. 3 and 4, during vibratory cycles of transducer 36, as the capacitive coupling of one of the electrodes to surface 20' increases the capacitive coupling between the other electrode and surface 20' decreases, and vice-versa. The rate induced signals on electrodes 32, 34 are coupled through the followers 40, 42 and processed by the networks in FIG. 7 to provide the sum and difference signals on terminals 114 and 120, respectively. The signal on terminal 114 contains dynamic data of the field or potential associated with surface 20', and the signal on terminal 120 is proportional to the magnitude of the constant voltage between probe 18 and surface 20'. The signals in the paths or channels associated with terminals 114 and 120 are summed in the output follower 172 which, in turn, has an output connected to the common line 136 connected to the various common points of the circuit of FIG. 7 and the common of electrodes 32, 34 and probe 18. In this way, the system common is feedback-driven to follow both the a.c. and d.c. components of the data on surface 20'. These a.c. and d.c. components, in turn, are read out by device 200 which also is connected to the follower output and the circuit ground. As a result, the system of FIG. 7 is a high bandwidth non-contacting voltage follower.

In the circuit of FIG. 7, as previously explained the signal representing the difference between the outputs of followers 40, 42 also can contain dynamic data. Filtering of the outputs of followers 40, 42 at a point prior to the network which develops the difference between these signals will remove the response of this path or channel to frequencies well above the frequency of operation of transducer 36. Such filtering is provided by the combination of resistor 130 and capacitor 142 and by the combination of resistor 122 and capacitor 140. With resistors 122 and 130 each having a magnitude of about 1 kilohm and capacitors 140 and 142 each having a magnitude of about 0.15 microfarads, and with the frequency of oscillator 150 being about 500 hertz, the frequency response of this filter combination will roll off at about 1 kilohertz. Each of the resistors 116, 118, 128, and 132 has a magnitude of about 1 kilohm, and amplifier 126 has a gain of minus one.

Demodulator 156 preferably is a double balanced demodulator which operates according to the relationship, $e_{out} = E\max_{in} \cos \theta$, where $e_{out}$ is the demodulator output, $E\max_{in}$ is the demodulator input obtained from the difference signal on terminal 120, and $\theta$ is the phase angle between the signal from oscillator 150 and the difference signal on terminal 120 applied to the demodulator input. The double balanced demodulator 156 uses the difference signal on terminal 120 to determine the amplitude and phase of the difference signal relative to the transducer driving signal, which is the output of oscillator 150. The circuit channel associated with the difference signal on terminal 120 discriminates against all signals other than the difference signal caused by vibration of the transducer 36. The bandwidth of the oscillator-demodulator combination is about 100 hertz.

The circuit channel or path in the system of FIG. 7 which processes the difference signal from terminal 120 need only be a relatively slow speed channel to accomodate drift and other offsets in amplifier 126. After the difference signal is demodulated, it proceeds further through the channel to the integrator or low pass filter comprising the combination of integrating amplifier 166 and capacitor 170. The filter is designed to roll off at a low frequency relative to that of oscillator 150 so as to make this difference signal channel unresponsive to the dynamic data. For example, by selecting a frequency roll off at 100 hertz and with the gain of amplifier 166 being 1/RC, it is determined that capacitor 170 has a magnitude of about 0.016 microfarads and resistor 164 has a magnitude of about 100 kilohm. Resistor 182 has a magnitude of about 10 kilohm.

The path or channel in the circuit of FIG. 7 associated with the sum signal on terminal 114 is the high speed channel. The response of this channel can be designed to augment the other channel to give an overall frequency response which is flat from d.c. to frequencies well above the frequency of vibration of transducer 36. For example, in order to have the frequency response flat from d.c. to about 50 kilohertz where the response then would roll off, capacitor 180 should have a reactance of about 10 kilohms at frequencies within the frequency response of the low frequency or low speed channel associated with the difference signal on terminal 120. Each of the resistors 110 and 112 has a magnitude of about 2 kilohms. It should be noted that if the frequency response of the high speed channel extends down to for example one-tenth of the frequency of vibration of transducer 36, the high speed channel would not allow frequencies on test surface 20' which are equal to the frequency of vibration of transducer 36 to appear at the followers 40 or 42. Accordingly, there would be no interference from these special frequencies. As a result, separation of the C(dV/dt) and V(dC/dt) components of the detector signals is accomplished. The foregoing magnitudes given for the various capacitors and resistors have been given for the particular oscillator output frequency and system frequency responses and are subject to change for different oscillator frequencies and system frequency responses.

Thus, in the system of FIG. 7 probe 18 furnishes the data required to distinguish electrically the static and dynamic data on the electrically charged surface under test. The signal containing only dynamic data, the sum signal on terminal 114, is applied to the high speed follower, the output of which is reapplied back to the probe body and preamplifier common returns. This feedback connection closes the loop back to unity gain and causes the probe to follow the dynamic data on the test surface with high accuracy. In addition, the difference signal on terminal 120 which contains signals proportional to the average or static (d.c.) voltages on the test surface is used in a separate loop which contains the demodulator and integrating amplifier to adjust the average value of the voltage applied to the follower to cause it to follow the static or d.c. data on the test surface.

Figure 8:
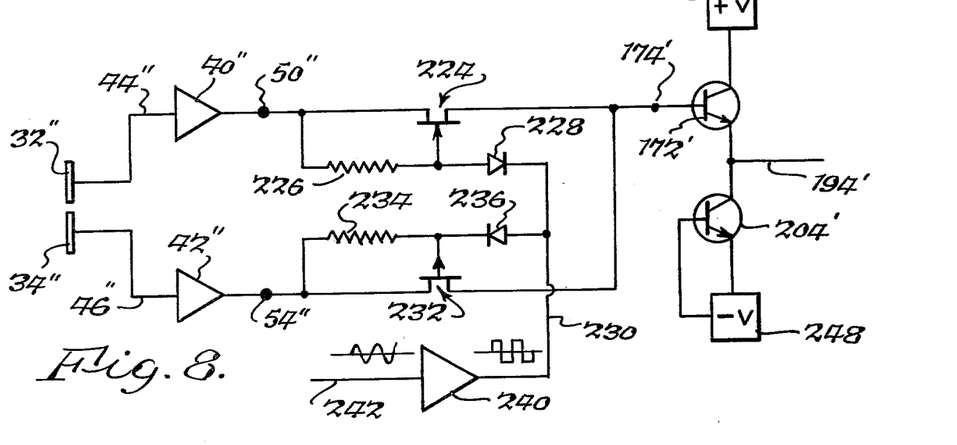
FIG. 8 is a schematic circuit diagram of a voltage follower according to another embodiment of the present invention.

FIG. 8 shows a circuit according to another embodiment of the present invention for demodulating the difference signal derived from the probe follower amplifiers, simultaneously processing the sum and difference signals, and applying the sum and demodulated difference signals to the output follower amplifier along a single data channel. As shown in FIG. 8, the voltage sensitive electrode or detector 32" is connected by line 44" to the input of probe follower amplifier 40", the output of which is connected to probe output 50". Similarly, sensitive electrode or detector 34" is connected by line 46" to the input of probe follower amplifier 42", the output of which is connected to probe terminal 54". For simplicity, the transducer for vibrating the electrodes as well as the probe housing are not shown, it being understood that these components and electrical connections thereto are the same as in the probe of FIGS. 2 and 7. The circuitry to the right of the terminals 50", 54" as viewed in FIG. 8 is external to the probe like the circuitry of FIG. 7.

Any dynamic data on the test surface would couple into the electrode 32" or electrode 34" by the C(dV/dt) term to cause signals to appear at the output of the amplifiers 40" and 42". The coupling would be to either electrode 32" or electrode 34" or to both of them depending upon the position of the vibrating electrodes when the dynamic data is present. At one extreme position of the vibrator cycle, if the electrode 32" is fully exposed to the test surface and a switch connecting the output of amplifier 40" to the subsequent follower stage were closed, any dynamic data would be transferred to that follower stage. Similarly, at the other extreme of the vibrator cycle, the electrode 34" would be completely exposed to the test surface, and if a switch connected between amplifier 42" and the subsequent follower stage were closed, dynamic data would be transferred to the subsequent follower stage. When the vibrator is at the center point of the cycle as shown in FIG. 3B, the coupling from the test surface would be to both the electrodes 32", 34" and at this time either switch connected to the output of amplifier 40" or 42" could be closed.

The circuit of FIG. 8 implements the foregoing switching operation as a function of the position of the vibrating member. A field effect transistor switch is connected between each probe follower amplifier and the output follower stage, and the f.e.t. transistor switches are operated from the same voltage source which excites the vibrator into oscillation. In particular, a first semiconductor switch in the form of an N channel f.e.t. transistor 224 is connected with the source and drain electrodes thereof in series with probe output terminal 50" and the terminal 174' connected to the input of the output follower amplifier 172'. The gate or control terminal of transistor 224 is connected through a resistor 226 to the probe output terminal 50", and the gate terminal also is connected to the anode of a diode 228, the cathode of which is connected to a line 230 on which a control signal is present in a manner which will be described. A second semiconductor switch in the form of a P channel f.e.t. transistor 232 is connected with the source and drain terminals thereof connected in series between the probe output terminal 54" and the follower input terminal 174'. The control or gate terminal of f.e.t. transistor 232 is connected through a resistor 234 to the probe output terminal 54", and the gate terminal also is connected to the cathode of a diode 236, the anode of which is connected to line 230. Each transistor 224 and 232 behaves electrically as a closed switch between the source and drain terminals in the absence of a voltage of sufficient amplitude applied to the gate terminal, and each behaves electrically as an open switch between source and drain when a voltage of sufficient amplitude is applied to the gate terminal. Line 230, in turn, is connected to the output of an amplifier 240, the input of which is connected by a line 242 to the source of the driving signal for the vibrator which, for example, is the oscillator 150 in the circuit of FIG. 7. Amplifier 240 functions to convert a sinusoidal input signal into a square wave output signal in the manner illustrated in FIG. 8. This is accomplished by applying the sinusoidal signal to the negative terminal of the amplifier and operating the amplifier in an open loop mode. This insures that no dynamic data is missed while the waveform and position of the vibrator are in a transition area, i.e. the transisior switches are operated from a square wave of the same frequency and phase as the vibrator drive frequency. In the circuit of FIG. 8, the transistor switch 224 is turned on for positive outputs of amplifier 240 while the transistor switch 232 is turned on for negative values of output voltage from amplifier 240. In the circuit of FIG. 8, the output follower amplifier 172 is connected between sources of positive and negative voltage 246 and 248, respectively, similar to the sources 190 and 210 in the circuit of FIG. 7. The emitter of the transistor amplifier 172' is connected by line 194' to the circuit output terminals in a manner similar to that of the circuit shown in FIG. 7.

If the test surface contains any static or d.c. information, signals are generated at the outputs of amplifiers 40" and 42" which signals are sinusoidal having the same frequency as that of the vibrator but being of opposite phase. The amplitude of such sinusoidal signals is proportional to the amplitude of the static information. The phase of the sinusoidal waveforms relative to the phase of the vibrator signal is either zero degrees or 180 degrees depending upon the polarity of the static data. The foregoing is illustrated further by the waveforms of FIG. 9 wherein waveform 250 represents the signal applied to the vibrator, and waveforms 252 and 254 indicate the signals at the outputs of amplifiers 40" and 42", respectively, when the test surface bears a positive d.c. voltage. The waveforms 256 and 258 represent the signals at the outputs of amplifiers 40" and 42", respectively, when the voltage on the test surface has a negative value. Waveform 260 is the demodulator output signal applied to terminal 174' in the circuit of FIG. 8 when the voltage on the test surface is of a positive value, and waveform 262 is the demodulator output signal applied to terminal 174' when the voltage on the test surface has a negative value. Thus, the output of the demodulator circuit of FIG. 8 for positive or negative static levels on the test surface is a d.c. level which is correlated in polarity with the test surface polarity. This signal then can be used to establish a d.c. bias for the output follower to enable it to follow the d.c. or static data on the test surface.

Figure 9:
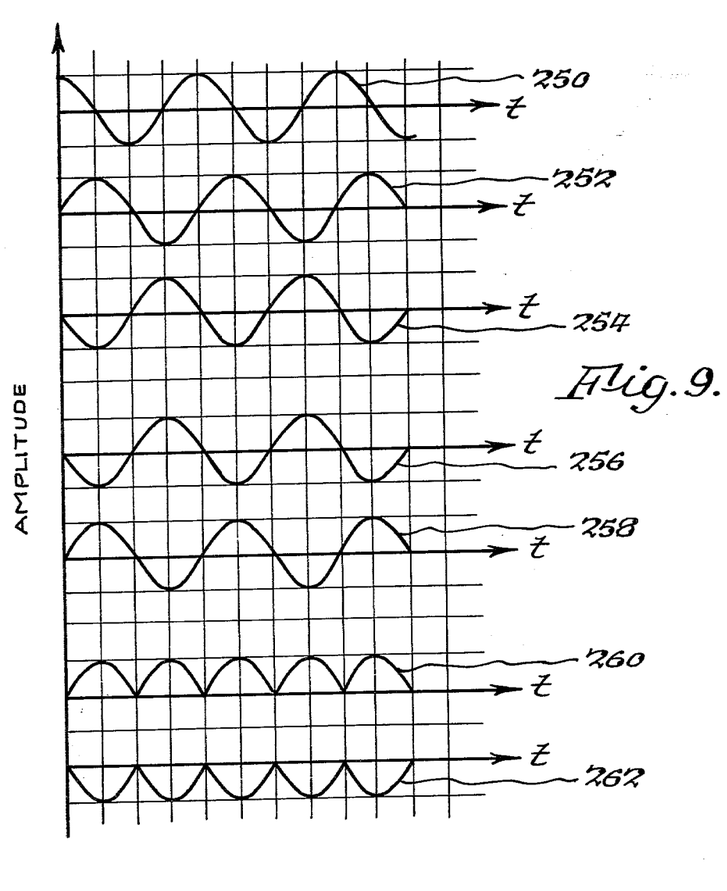
FIG. 9 is a graphic of waveforms illustrating operation of the circuit of FIG. 8.

In the waveforms of FIG. 9, it will be noted that there is a 90 degree phase shift between the vibrator position signal, as represented by waveform 250, and the signals induced on the detectors 32" and 34" as seen from the waveforms 252, 254. The phase shift occurs because the induced voltages on the surfaces of the sensitive electrodes due to d.c. information on the test surface are rated induced. These induced voltages are a maximum when the rate of change of capacitance is a maximum. The maximum rate of capacitance change occurs as the vibrator passes through the center position, i.e. the position shown in FIG. 3B. Amplifier 240 serves to shift the phase back to cause a zero phase shift between the reference and detector signals at the demodulator.

The detector and demodulator illustrate in FIG. 8 can supply signals which are unique for either static or dynamic test surface data. In other words, it recognizes whether the signal at the output of the detectors, i.e. terminals 50", 54", are generated because of $C(dV/dt)$ or $V(dC/dt)$.

Figure 10:
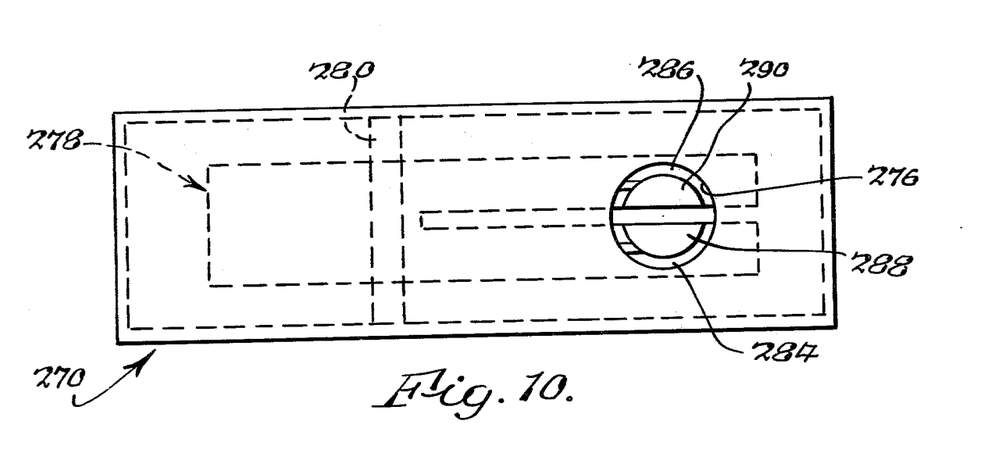
FIG. 10 is an elevational view of a sensor according to another embodiment of the present invention.
Figure 11:
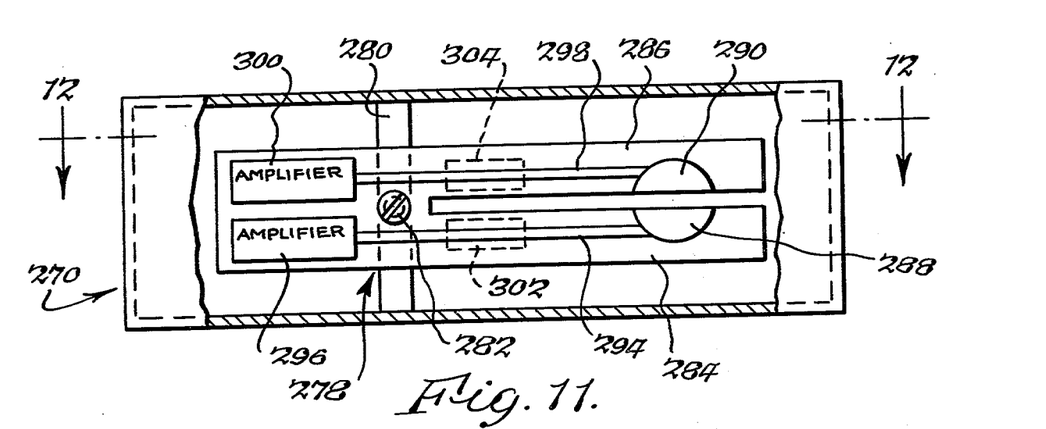
FIG. 11 is an elevational view similar to FIG. 10 with parts removed to illustrate the sensor interior.
Figure 12:
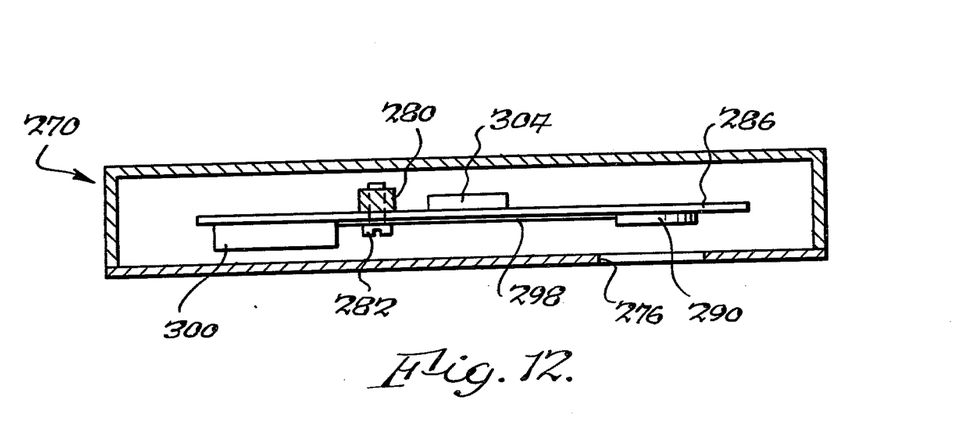
FIG. 12 is a sectional view taken about on line 12—12 in FIG. 11.

FIGS. 10–12 illustrate a probe arrangement according to another embodiment of the present invention. The probe includes a housing 270 which is hollow rectangular in shape and which is provided with an aperture 276 in one of the side walls thereof. Aperture 276 is disposed in a plane parallel to the housing longitudinal axis and in the device shown in circular but can have other shapes. The probe further includes vibrator means in the form of a tuning fork 278 disposed within housing 270 such that the longitudinal axes of the housing and tuning fork are generally parallel. Fork 278 is attached to a mounting element 280 fixed to housing 270 by suitable fastening means in the form of screw 282. Fork 278 has a pair of spaced apart tines 284, 286 which are located such that a portion of each tine adjacent the free end thereof is in registry with opening 276. The slot or gap between the tines terminates at a point spaced a small distance from the mounting of fork 270 to member 280. The tuning fork 270 is disposed such that tines 284, 286 vibrate in directions generally normal to the plane of opening 276.

In the probe shown in FIGS. 10-12, the voltage sensitive electrodes or detectors are in the form of areas or regions 288 and 290 of conductive material on the surfaces of tines 284 and 286, respectively, facing aperture 276. Detector area 284 is connected electrically by a conductive strip or path 294 to a follower type amplifier 296. Detector area 290 is connected electrically by a conductive strip or path 298 to a follower type amplifier 300. The detector areas, conductor paths and amplifier circuitry are produced on the same side of the turning fork 278 by standard etching techniques, the amplifier being located on the base or unitary end of the tuning fork opposite the ends of the tines. The turning fork 278 is vibrated by means of piezoelectric driver elements or chips 302 and 304 mounted on tines 284 and 286 at the ends opposite the free ends and on the surface of the tuning fork opposite the surface bearing the detectors and amplifiers. Electrical signals are applied to drivers 302, 304 by suitable means causing them to vibrate tines 284, 286 in a known manner.

The detector areas 288, 290 are semicircular in the device shown and always are totally exposed through aperture 276 to an external field or potential being measured. Drivers 302, 304 are energized in a manner such that the tuning fork tines and hence the detectors 288, 290 are vibrated 180 degrees out of phase. In other words, as one detector moves toward aperture 276 the other detector moves away from the aperture and vice-versa. Thus, as the capacitive coupling of one detector to the test surface is increasing the capacitive coupling of the other detector to the test surface is decreasing, and vice-versa. This out-of-phase motion of the detectors will cause the voltages induced on the detectors by a test surface static voltage to be 180 degrees out of phase, while any dynamic data on the test surface will induce in-phase signals on the detector surfaces. These two kinds of data which are induced on the detectors are processed through a phase sensitive demodulator such as that described in connection with FIG. 8, to provide a signal containing both dynamic data and demodulated static data which is applied to a follower amplifier, the output of which follower is reapplied back to a common circuit for the detectors. This feedback, as in the previous embodiments, causes the system to function as a high accuracy non-contacting voltmeter having a large bandwidth.

It is therefore apparent that the present invention accomplishes its intended objects. While several embodiments of the present invention have been described in detail, this is for the purpose of illustration, not limitation.

I claim:

1. A non-contacting voltage follower comprising:
   (a) a pair of voltage sensitive electrodes;
   (b) means for varying the capacitive coupling between said electrodes and an electrical field or potential to which said electrodes are exposed and in an inverse manner to induce signals on said electrodes;
   (c) means for defining an electrical reference surface exposed to said electrical field or potential;
   (d) an output amplifier having an input and an output and connected as a voltage follower;
   (e) signal processing circuit means having a pair of inputs and an output, means for coupling one of said circuit inputs to one of said electrodes, means for coupling the other of said circuit inputs to the other of said electrodes, and means for coupling said circuit output to said output amplifier input, said circuit means applying to said amplifier signals containing static and dynamic data of the electrical field or potential derived from said signals induced on said electrodes; and
   (f) means for coupling the output of said amplifier to said electrical reference surface;
   (g) whereby said amplifier output follows the static and dynamic characteristics of the electrical field or potential.

2. Apparatus according to claim 1 further including a housing containing said electrodes, said housing having an operative surface provided with an opening therein through which said electrodes are exposed to an external electrical field or potential.

3. Apparatus according to claim 2, wherein said housing operative surface is of electrically conducting material and electrically coupled to said electrodes thereby serving as said electrical means for providing said reference.

4. Apparatus according to claim 2, wherein said means for varying the capacitive coupling comprises vibrator means in said housing operatively connected to said electrodes for vibrating said electrodes relative to said opening to vary the capacitive coupling between said electrodes and the external field or potential as a function of the rate of vibration of said electrodes and in a manner such that said capacitive coupling of one electrode varies inversely with respect to said capacitive coupling of the other electrode.

5. Apparatus according to claim 4, wherein each electrode has an operative surface disposed in a plane substantially parallel to the plane of said opening and said electrodes are vibrated in said plane.

6. Apparatus according to claim 4, wherein each electrode is moved between a position where a minimum portion of each electrode is exposed to a position where a maximum portion of each electrode is exposed during each vibratory cycle thereof.

7. Apparatus according to claim 4, wherein each electrode is moved between a position where each electrode is out of registry with the area of said opening to a position where each electrode is in registry with the entire area of said opening during each vibratory cycle thereof.

8. Apparatus according to claim 4, wherein each electrode has an operative surface disposed in a plane substantially parallel to the plane of said opening and said electrodes are vibrated in a direction normal to said plane.

9. Apparatus according to claim 8, wherein the operative surface of each electrode is entirely exposed to said opening during each vibratory cycle thereof and said electrodes are vibrated 180 degrees out of phase.

10. Apparatus according to claim 1, wherein said signal processing circuit means comprises:
    (a) means defining a first channel between said electrodes and said follower input, said channel including circuit means for developing the sum of said signals induced on said electrodes; and
    (b) means defining a second channel between said electrodes and said follower input, said second channel including circuit means for developing the difference between said signals induced on said electrodes and means for rendering said second channel unresponsive to dynamic characteristics of said electrical field or potential.

11. Apparatus according to claim 4, wherein said signal processing means comprises:
    (a) first circuit means coupled to said electrodes for developing the sum of said signals induced on said electrodes;
    (b) first coupling means for applying said signal sum to the input of said follower;
    (c) second circuit means coupled to said electrodes for developing the difference between said signals induced on said electrodes;
    (d) demodulator means having an input connected to said second circuit means and an output, said demodulator means providing an output signal proportional to the static characteristics of the field or potential; and
    (e) second coupling means for applying said demodulator output to the input of said follower.

12. Apparatus according to claim 11, wherein said first coupling means comprises a capacitor.

13. Apparatus according to claim 11, wherein said second coupling means comprises an integrating amplifier.

14. Apparatus according to claim 4, wherein said signal processing means comprises:
    (a) first semiconductor switching means having a control terminal and a pair of terminals, one of which is coupled to one of said electrodes and the other of which is connected to said follower input;
    (b) second semiconductor switching means having a control terminal and a pair of terminals, one of which is coupled to the other of said electrodes and the other of which is connected to said follower input;

(c) means operatively coupled to said vibrator means for providing an alternating square wave signal correlated in frequency and phase with the output of said vibrator means; and (d) circuit means connected to said signal providing means and to said control terminals of said first and second switching means for applying the positive portions of said square wave signal to one of said switching means and the negative portions of said square wave signal to the other of said switching means.

15. Apparatus according to claim 1 wherein said signal processing circuit means further includes a pair of follower type amplifiers each having an input and an output, said follower type amplifier inputs being connected to corresponding ones of said voltage sensitive electrodes, each of said follower type amplifier outputs being connected to said signal processing means, said follower type amplifiers providing high impedance loads for said electrodes.

16. A sensor for a non-contacting voltmeter comprising:

(a) a housing including an operative surface for disposing toward an external electrical field or potential being measured and said surface having an opening therein;

(b) a pair of voltage sensitive electrodes within said housing, each of said electrodes having an operative surface disposed to be exposed through said opening to the external electrical field or potential being measured; and (c) vibrator means carried by said housing operatively connected to said electrodes for vibrating said electrodes relative to said opening to vary the capacitive coupling between said operative surfaces of said electrodes and the external field or potential being measured as a function of the rate of vibration of said electrodes, said vibrator means vibrating said electrodes in a manner such that said capacitive coupling of one electrode varies inversely with respect to said capacitive coupling of the other electrode;

(d) whereby signals are induced on said electrodes containing information of the static and dynamic characteristics of the external field or potential being measured.

17. Apparatus according to claim 16, wherein said housing operative surface is of electrically conducting material.

18. Apparatus according to claim 17, wherein said electrodes are coupled electrically to said housing operative surface which thereby serves as a reference.

19. Apparatus according to claim 16, wherein each electrode operative surface is disposed in a plane substantially parallel to the plane of said opening and said electrodes are vibrated in said plane.

20. Apparatus according to claim 16, wherein each electrode is moved between a position where a minimum portion of said electrode surface is exposed to a position where a maximum portion of each electrode surface is exposed during each vibratory cycle thereof.

21. Apparatus according to claim 16, wherein each electrode is moved between a position where each electrode is out of registry with the area of said opening to a position where each electrode is in registry with the entire area of said opening during each vibratory cycle thereof.

22. Apparatus according to claim 16, wherein each electrode has an operative surface disposed in a plane substantially parallel to the plane of said opening and said electrodes are vibrated in a direction normal to said plane.

23. Apparatus according to claim 22, wherein the operative surface of each electrode is entirely exposed to said opening during each vibratory cycle thereof and said electrodes are vibrated 180 degrees out of phase.

* * * * *